(12) United States Patent
Toyoda

(10) Patent No.: US 6,674,299 B2
(45) Date of Patent: Jan. 6, 2004

(54) SEMICONDUCTOR TESTER, SEMICONDUCTOR INTEGRATED CIRCUIT AND SEMICONDUCTOR TESTING METHOD

(75) Inventor: Hiroyuki Toyoda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 143 days.

(21) Appl. No.: 10/032,572

(22) Filed: Jan. 2, 2002

(65) Prior Publication Data

US 2002/0121916 A1 Sep. 5, 2002

(30) Foreign Application Priority Data

Mar. 5, 2001 (JP) ........................................ 2001-060606

(51) Int. Cl.[7] .............................................. G01R 31/26
(52) U.S. Cl. ...................................................... 324/765
(58) Field of Search .............................. 324/158.1, 765, 324/759, 755, 527, 528; 365/185.24, 185.18; 361/18, 21, 31, 33, 88, 100, 101; 307/85–87

(56) References Cited

U.S. PATENT DOCUMENTS 5,557,574 A * 9/1996 Senoo et al. ................. 365/201
6,034,905 A * 3/2000 Suzuki et al. ................ 365/201

FOREIGN PATENT DOCUMENTS

JP          10-2935          1/1998

* cited by examiner

Primary Examiner—Kamand Cuneo
Assistant Examiner—Trung Nguyen
(74) Attorney, Agent, or Firm—Birch, Stewart, Kolasch & Birch, LLP

(57) ABSTRACT

The voltage output terminals of a semiconductor integrated circuit are connected to the first ends of resistors while the second ends of the resistors are connected to a common signal line. Taking advantage that the potential of the signal line presents the mean voltage value of the voltages output from all the voltage output terminals, the deviation of the potential at each voltage output terminal from the mean value and the difference of this mean value from the ideal value are determined, whereby the suitability of the output voltage from each of the output terminals is examined.

6 Claims, 6 Drawing Sheets

SEMICONDUCTOR TESTER, SEMICONDUCTOR INTEGRATED CIRCUIT AND SEMICONDUCTOR TESTING METHOD

BACKGROUND OF THE INVENTION (1) Field of the Invention

The present invention relates to a semiconductor tester, semiconductor integrated circuit and semiconductor testing method for checking the output voltages from a semiconductor integrated circuit.

(2) Description of the Prior Art

With the development of liquid crystal display panels (to be referred to hereinbelow as LCD panels) into high definition, liquid crystal display driver ICs (to be referred to hereinbelow as LCD driver ICs) tend to have a greater number of outputs with a greater number of tonal voltage levels. In general, the tonal voltage levels for a LCD driver IC are determined based on the resistive division ratios or capacitive division ratios to the voltage applied from the reference power input terminal of a gamma control resistive circuit and gamma control capacitive circuit incorporated in the device as a reference voltage generating circuit, and the more the tonal levels there are, the more division ratios are broken down into smaller sections.

In order to achieve display of multi-leveled tones, LCD drivers incorporate digital/analog converters (to be referred to hereinbelow as D/A converters) for converting the input digital image data corresponding to the number of tonal voltage levels into analog tonal voltage outputs and output the tonal voltages. For example, a LCD driver IC for 256 tones of display incorporates 8-bit D/A converters.

In the testing of such a multi-output, multi-tonal LCD driver IC, it is normally checked whether each D/A converter converts all the tones of digital input image data into correct levels of voltage and whether the tonal voltages corresponding to an individual tone are converted equally between all the D/A converters.

The checkout of the IC drivers in this case is generally based on three criteria, namely, the maximum positive and negative deviations of the tonal output voltages from all the output terminals with respect to the ideal voltage for each tonal output voltage level, and the variation of the tonal output voltages from all the output terminals (the sum of the maximum positive and negative deviations among all the output voltage terminals). For example, a device of which the maximum positive deviation and maximum negative deviation of actual tonal output voltages from the ideal tonal output voltage fall outside of ±30 mV and the variation among all the output terminals falls outside of about 35 mV should be rejected as a defective. Thus, the checkout demands a markedly high precision of measurement.

FIG. 1 is a chart showing one example of the tonal voltage output test result. In the example shown in this chart, a product is determined to be non-defective if the absolute values of the maximum positive and negative deviations are equal to or lower than 30 mV and the variation among all the output terminals is equal to or lower than 35 mV.

In the testing of LCD driver ICs, input terminal leakage test, functional operation test, electric current consumption test, etc., are also implemented other than the above-described tonal voltage output test. However, the tonal voltage test takes up to about 80% of the total testing time of all these test items. Further, the trend toward increased number of outputs and tones of LCD driver ICs tends to further increases the time required for tonal voltage output test.

This means that reduction of the testing time taken for the tonal voltage output test is the most critical factor in reducing the testing time and cost of LCD driver ICs.

In order to measure the tonal output voltages accurately, it is preferred that the semiconductor tester should have as many voltmeters of a high precision as the number of the tonal output terminals. But if the device is so configured, it becomes too expensive and large-sized. Therefore, from economic and other view points, the number of voltmeters incorporated in a semiconductor tester has been limited to one to a few.

In order to implement the tonal voltage output test with high accuracy in a short time, various methods have been proposed in consideration of economy.

For example, according to the invention of Japanese Patent Application Laid-Open Hei 10 No. 2935, a semiconductor tester is disclosed which comprises: a multiple number of sample hold circuits for sampling the multiple voltages to be tested from a test specimen such as an LCD driver IC or the like, at the same time, in a single operation; a multiplexer for sequentially selecting the multiple sample hold circuits, one by one, so as to output the selected output; and a checkout circuit for checking whether the voltage to be tested, sequentially output from the multiplexer circuit, is suitable based on the associated upper and lower limit voltages.

This disclosure claims that it is possible to reduce the time taken for tonal voltage output test while keeping the precision of measurement since all the tonal output terminals can be checked by using a limited number of voltmeters of high precision and rapidly switching them.

However, this disclosure does not mention the testing of the variation among output terminals. In this case if the test of the variation among output terminals is implemented, this would be performed by storing the voltages from all the output terminals, extracting the maximum and minimum values among the output terminals, calculating the difference between the extracted maximum and minimum values, and comparing the result with the associated reference value.

However, according to the invention described in Japanese Patent Application Laid-Open Hei 10 No. 2935, since the voltages output from the device to be tested are measured terminal by terminal, the upper and lower limit voltages as the reference values need to be reset for every tone or every test voltage level.

The number of voltage measurements is the product of the number of voltage output terminals of the device to be tested and the number of output voltage tones. That is, a device with many tones and many outputs needs an enormous time for testing, resulting in unfeasibility. For an LCD driver IC having 480 outputs and 256 tones, for example, because two output voltages, positive and negative, are needed for each tone, the number of measurements is calculated as the product of the number of outputs, 480, the number of tones, 256, and 2 for positive and negative, which amounts to about 250,000 checks. If one measurement needs about 0.1 millisecond, the test will take up to 25 seconds for each device.

Other than the time for switching the high-precision voltmeter to each tonal voltage terminal, the time needed for one measurement is also largely dependent on the voltage measurement time for actually measuring each tonal voltage and the calculation time for calculating the amount of output variation from terminals. Therefore, even if the switching time of the high-precision voltmeter to each tonal voltage terminal can be made short, it is impossible to sharply reduce the time of measurement. So there remains the problem of reducing the measurement time as long as the test is performed by measuring all the output voltages.

SUMMARY OF THE INVENTION

It is therefore an object of the present invention to provide a simple and low-cost semiconductor tester, semiconductor integrated circuit and semiconductor testing method, which make it possible to perform rapid check of output voltages from a multiple number of output terminals of a semiconductor integrated circuit.

In order to achieve the above object, the present invention is configured as follows:

In accordance with the first aspect of the present invention, a semiconductor tester for checking the output voltages of a semiconductor integrated circuit having a multiple number of output terminals which output predetermined voltages, includes: a judgement means which, with reference to the mean voltage value of the voltages output from all the output terminals of the semiconductor integrated circuit, judges the suitability of the output voltage from each of the output terminals.

In accordance with the second aspect of the present invention, the semiconductor tester having the above first feature is characterized in that the judgement means comprises: a multiple number of resistors connected at their first ends to the respective output terminals and at their second ends to a common signal line; and a first comparing means which compares the potential difference between both ends of each resistor with a predetermined first reference voltage value.

In accordance with the third aspect of the present invention, the semiconductor tester having the above first feature is characterized in that the judgment means comprises a second comparing means for comparing the mean voltage value with a predetermined second reference voltage value.

In accordance with the fourth aspect of the present invention, the semiconductor tester having the above second feature is characterized in that the judgment means comprises a second comparing means for comparing the mean voltage value with a predetermined second reference voltage value.

In accordance with the fifth aspect of the present invention, a semiconductor integrated circuit having a multiple number of output terminals which output predetermined voltages, includes: a judgement signal output means which, with reference to the mean voltage value of the voltages output from all the output terminals, outputs signals representing the suitability of the output voltages from the output terminals.

In accordance with the sixth aspect of the present invention, the semiconductor integrated circuit having the above fifth feature is characterized in that the judgement signal output means comprises: a multiple number of resistors connected at their first ends to the respective output terminals and at their second ends to a common signal line; and a first comparing means which compares the potential difference between both ends of each resistor with a predetermined first reference voltage value.

In accordance with the seventh aspect of the present invention, the semiconductor integrated circuit having the above fifth feature is characterized in that the judgment signal output means comprises a second comparing means for comparing the mean voltage value with a predetermined second reference voltage value.

In accordance with the eighth aspect of the present invention, the semiconductor integrated circuit having the above sixth feature is characterized in that the judgment signal output means comprises a second comparing means for comparing the mean voltage value with a predetermined second reference voltage value.

In accordance with the ninth aspect of the present invention, a semiconductor testing method of checking the output voltages of a semiconductor integrated circuit having a multiple number of output terminals which output predetermined voltages, includes the step of judging the suitability of the output voltage from each of the output terminals, with reference to the mean voltage value of the voltages output from all the output terminals of the semiconductor integrated circuit.

In accordance with the tenth aspect of the present invention, the semiconductor testing method having the above ninth feature is characterized in that the step of judgement includes a first comparing step for comparing the potential difference between both ends of each of a multiple number of resistors with a predetermined first reference voltage value, the multiple number of resistors being connected at their first ends to the respective output terminals and at their second ends to a common signal line.

In accordance with the eleventh aspect of the present invention, the semiconductor testing method having the above ninth feature is characterized in that the step of judgement includes a second comparing step for comparing the mean voltage value with a predetermined second reference voltage value.

In accordance with the twelfth aspect of the present invention, the semiconductor testing method having the above tenth feature is characterized in that the step of judgement includes a second comparing step for comparing the mean voltage value with a predetermined second reference voltage value.

Next, the operation and effect of the present invention will be described.

In accordance with the semiconductor tester of the present invention, the output voltages of a semiconductor integrated circuit having a multiple number of output terminals which output predetermined voltages are checked with reference to the mean voltage value of the voltages output from all the output terminals. That is, this mean voltage value is used as the reference voltage value, based on which the suitability of the output voltage from each of the output terminals is judged. Therefore, it is possible to simply set the reference voltage value, which should be changed every time the voltage to be tested is changed for a different level of tone.

It is also possible to reduce the number of voltage sources needed when comparison with the reference voltage values is to be made.

Since the judgement means includes a multiple number of resistors connected at their first ends to the respective output terminals and at their second ends to a common signal line, the common line connected to the second ends of the resistors presents the mean value of all the output voltages, conforming to the Kirchhoff's law. Therefore, the potential difference between both ends of each resistor can be detected easily as the deviation of the potential at the output terminal to which the first end of the resistor is connected, from the mean output voltage value.

Further, since a first comparing means which compares this deviation with the first reference voltage value as the permissible value of variation and determines if each deviation falls within the permissible range is provided, it is possible to detect any anomaly instantly if any of the output terminals has a defect.

Moreover, this first reference voltage can and should be constant throughout the voltage test when the permissible voltage width is constant for all the tones. Therefore, it is no longer necessary to switch the reference voltage, which would have had to be changed every time the voltage to be tested should have been changed depending on the level of tone.

In the semiconductor tester of the present invention, since the judgement means includes a second comparing means for comparing the mean voltage value with a predetermined second reference voltage value, it is possible to smoothly perform rough detection of the error or deviation from the voltage to be output from each output terminal without performing direct measurement of the output voltages from all the terminals.

The semiconductor tester of the present invention includes a judgement signal output means which, with reference to the mean voltage value of the voltages output from all the output terminals, outputs signals representing the suitability of the output voltages from the output terminals, this mean voltage value is used as the reference voltage value, based on which the suitability of the output voltage from each of the output terminals is judged. Therefore, it is possible to simply set the reference voltage value, which should be changed every time the voltage to be tested is changed for a different level of tone.

It is also possible to reduce the number of voltage sources needed when comparison with the reference voltage values is to be made.

In accordance with the semiconductor integrated circuit of the present invention, since the judgement signal output means includes a multiple number of resistors connected at their first ends to the respective output terminals and at their second ends to a common signal line and a first comparing means which compares the potential difference between both ends of each of the resistors with the first reference voltage value, the second ends of the resistors present the mean value of all the output voltages, conforming to the Kirchhoff's law. Therefore, the potential difference between both ends of each resistor can be detected easily as the deviation of the potential at the output terminal to which the first end of the resistor is connected, from the mean output voltage value and is output to the outside of the semiconductor integrated circuit.

Further, since the first comparing means which compares this deviation with the first reference voltage value as the permissible value of variation and determines if each deviation falls within the permissible range is provided, it is possible to detect any anomaly instantly if any of the output terminals has a defect. Therefore, it is possible for an external device to easily detect anomalies of the output terminals.

Moreover, this first reference voltage can and should be constant throughout the voltage test when the permissible voltage width is constant for all the tones. Therefore, it is no longer necessary to switch the reference voltage, which would have had to be changed every time the voltage to be tested should have been changed depending on the level of tone.

Since the semiconductor testing method of the present invention includes the step of judging the suitability of the output voltage from each of the output terminals, with reference to the mean voltage value of the voltages output from all the output terminals of the semiconductor integrated circuit, this mean voltage value is used as the reference voltage value, based on which the suitability of the output voltage from each of the output terminals is judged. Therefore, it is possible to simply set the reference voltage value, which should be changed every time the voltage to be tested is changed for a different level of tone.

It is also possible to reduce the number of voltage sources needed when comparison with the reference voltage values is to be made.

Since the step of judgement includes a first comparing step for comparing the potential difference between both ends of each of a multiple number of resistors, which are connected at their first ends to the respective output terminals and at their second ends to a common signal line, with a predetermined first reference voltage value, the second ends of the resistors present the mean value of all the output voltages, conforming to the Kirchhoff's law. Therefore, the potential difference between both ends of each resistor can be detected easily as the deviation of the potential at the output terminal to which the first end of the resistor is connected, from the mean output voltage value.

Further, since a first comparing means which compares this deviation with the first reference voltage value as the permissible value of variation and determines if each deviation falls within the permissible range is provided, it is possible to detect any anomaly instantly if any of the output terminals has a defect.

Moreover, this first reference voltage can and should be constant throughout the voltage test when the permissible voltage width is constant for all the tones. Therefore, it is no longer necessary to switch the reference voltage, which would have had to be changed every time the voltage to be tested should have been changed depending on the level of tone.

In the semiconductor testing method of the present invention, since the step of judgement includes a second comparing step for comparing the mean voltage value with a predetermined second reference voltage value, it is possible to smoothly perform rough detection of the error or deviation from the voltage to be output from each output terminal without performing direct measurement of the output voltages from all the terminals.

DESCRIPTION OF THE PREFERRED EMBODIMENTS

The embodiment of the present invention will hereinafter be described with reference to the accompanying drawings.

Figure 1:
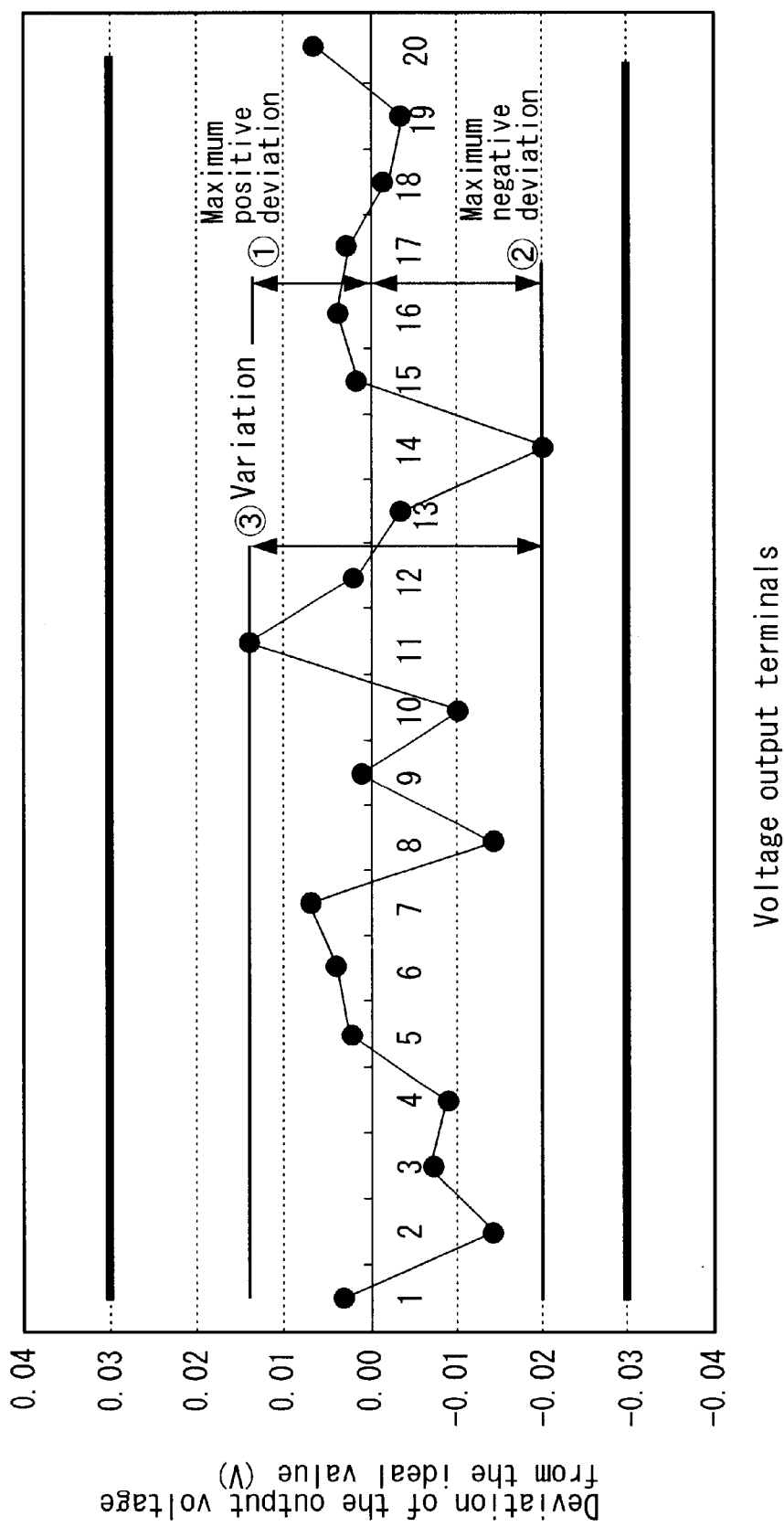
FIG. 1 is a chart showing one example of the measurement result in the prior art.
Figure 2:
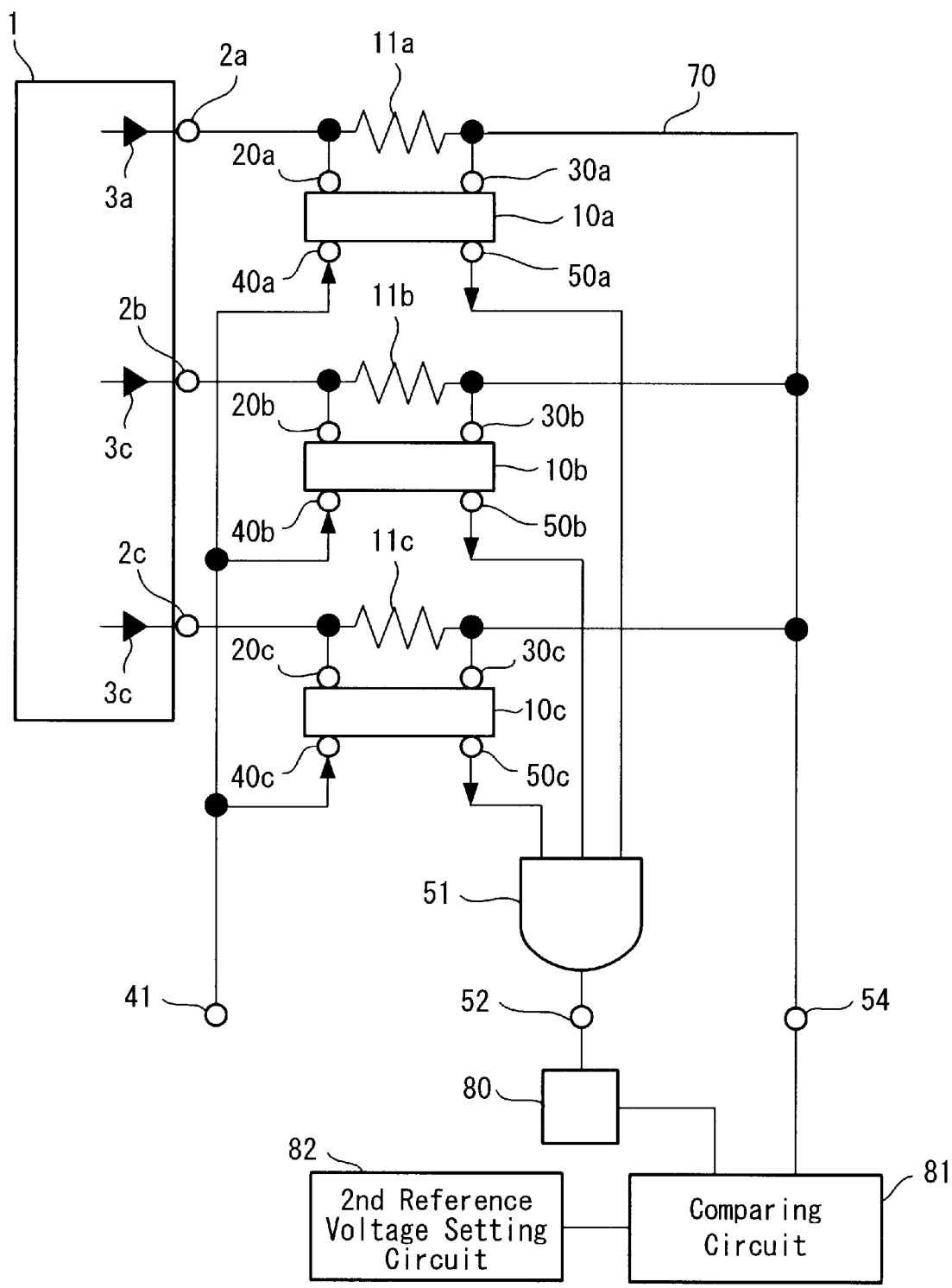
FIG. 2 is a diagram showing one example of the embodiment of the present invention.

FIG. 2 is a diagram showing the configuration of the embodiment of a semiconductor tester of the present invention. The embodiment shown in this figure includes a semiconductor integrated circuit 1 and resistors 11 (11a to 11c) and potentiometric devices 10 (10a to 10c). Each voltage output terminal 2 (2a to 2c) of semiconductor integrated circuit 1 is connected to the first end of the associated resistor 11 (11a to 11c) while resistors 11 (11a to 11c) are connected at their second ends to a common signal line 70.

This signal line 70 has an mean voltage output terminal 54 at its end. This mean voltage output terminal 54 is connected to a comparing circuit 81 for comparing the voltage value output from mean voltage output terminal 54 and a second reference voltage, which will be described later.

Each potentiometric device 10 (10a to 10c) has a judgement output port 50 (50a to 50c). These judgement output ports 50 (50a to 50c) are connected to a logical product operating device 51 so that the result of operation at logical product operating device 51 is output from a judgement output port 52.

Since a judgement display portion 80 is connected to the aforementioned comparing circuit and judgement output port 52, the test result can be visually checked through the display of judgement display portion 80.

Here, suppose that, for example, the resistance of resistors 11 (11a to 11c) have a resistance R(Ω), voltage output terminals 2 (2a to 2c) have output voltages of A, B and C(V), respectively, and the potential of signal line 70 is Q(V). Since signal line 70 is connected to the second ends of all the resistors 11 (11a to 11c) only, the sum of all the current from these terminals should be equal to zero. Therefore, the following equation holds:

$$(A-Q)/R+(B-Q)/R+(C-Q)/R=0.$$

This equation can be dissolved as:

$$Q=(A+B+C)/3.$$

Thus, it is understood that the potential of signal line 70 is equal to the mean voltage of the voltages output from voltage output terminals 2 (2a to 2c).

In this arrangement, the potentials of this mean voltage and each of the output voltages from voltage output terminals 2 (2a to 2c) are compared so as to detect the deviation of each output voltage to be tested from the mean value of all the output voltages, and the value of deviation is compared to a first reference voltage to be described later, so that the suitability of each voltage output terminal can be checked.

In the actual test, since each voltage output terminal 2 (2a to 2c) is connected to associated resistor 11 (11a to 11c), the output voltage will vary in accordance with the current supply capacity of voltage output terminal 2 (2a to 2c). The output voltage drop due to this can be minimized by making the resistance R so large as to reduce the current flowing into this resistor to the minimum. In this way, it is possible to secure a high precision.

Here, description of this embodiment was made with reference to a semiconductor integrated circuit 1 having three voltage output terminals. However, the same configuration is applied to the case with two voltage output terminals. Naturally, it is possible to apply the same configuration to a case where semiconductor integrated circuit 1 has four or more voltage output terminals and the four or more voltages output from these voltage output terminals are to be checked at the same time. Therefore, for a LCD driver IC having 480 voltage output terminals, all the voltage output terminals can be tested at the same time by providing 480 resistors and potentiometric devices.

In addition, since a second reference voltage setting circuit 82 and comparing circuit 81 are provided in order to check the potential of signal line 70, it is also possible to check whether the mean voltage value of voltage output terminals 2 (2a to 2c) is suitable by comparing the voltage of mean voltage output terminal 54 with the second reference voltage.

Figure 3:
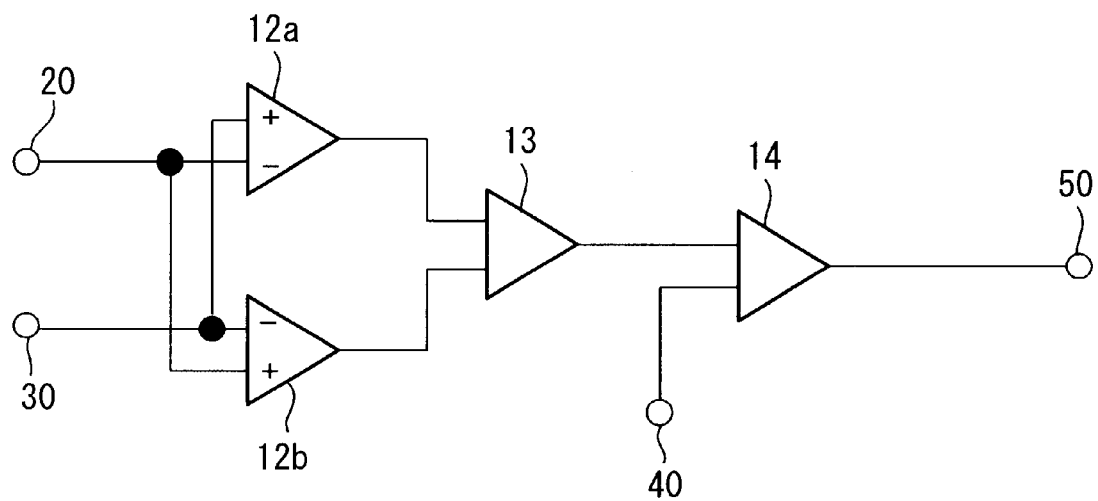
FIG. 3 is a diagram showing the configuration of a potentiometric device in the present embodiment.

FIG. 3 is a diagram showing the configuration of potentiometric device 10 (10a to 10c) of the present invention.

This arrangement shown in this diagram is an example of a potentiometric device for checking whether the potential difference between two terminals is equal to or lower than the preset first reference voltage value, and is a well-known configuration. In this example, the potentiometric device is constituted by amplifier 12, an adder 13 and a comparator 14. In this embodiment, the first reference voltage is set at 17.5 mV. Here, it should be noted that the first reference voltage is not limited to this value but can be set as appropriate in accordance with the specifications of the semiconductor integrated circuit to be tested.

The potential difference between voltage input terminal 20 and voltage input terminal 30 is detected by each amplifier 12. Here, each amplifier 12 is arranged so as to be able to pick up the absolute value of the potential difference between voltage input terminals 20 and 30, in order not to input a negative voltage.

The outputs from amplifiers 12 are supplied to adder 13, whereby it is possible to pick up the summation of the absolute values of the potential difference between voltage input terminals 20 and 30. The thus obtained value is input to one terminal of a comparator 14 and is compared by the comparator with a reference voltage, the first reference voltage value, which corresponds to the potential difference permitted between voltage input terminals 20 and 30 and is input to the other terminal of comparator 14, whereby it is judged whether the potential difference between voltage input terminals 20 and 30 falls within the desired range. Thus the suitability of each voltage output terminal 2 is determined and digitally output as a binary value '0' or '1'.

The potentiometric device used here is a mere example and should not limit the circuit configuration of the present embodiment, and any means can be used as long as it can check the potential difference between two terminals.

It should be noted that since the potential difference to be measured is amplified so as to be compared to the first reference voltage input from reference terminal 40, it is possible to make a comparison at a high accuracy even if the potential difference to be measured is markedly lower than a level of voltage which can be measured by a typical semiconductor tester.

For example, when the potential difference to be measured falling within the range of not higher than 10 mV is to be checked, the potential difference to be measured is amplified by 100 times by an amplifier while the reference voltage is set at 1 V. General semiconductor testers usually incorporate a voltage applying means which functions with precision for outputting voltages of 1 to 8 V since input voltages to logical circuits of semiconductor integrated circuits are often set at about 1 to 8 V.

Thus, it is advantageous to use 1 V as the reference voltage over using 10 mV which is the same level as the potential difference to be measured because it is possible to make examination with a high accuracy without the necessity of adding any extra device to the semiconductor tester. This is why the present embodiment adopts the above configuration.

When two or more potentiometric devices are used, calculation of the logical product or logical sum of all the outputs from judgement ports 50 (50a to 50c) enables the semiconductor tester to judge the suitability of the measurements from all the potentiometric devices, based on the judgment of one terminal only.

It should be noted that the present invention is not limited to the above circuit configuration, but all the circuit configurations having the same function, such as that in which the potential difference to be measured is amplified by adder 13 or comparator 14 or in which the reference voltage is reduced to one hundredth, can be applied to the embodiments of the present invention.

Next, the testing method of a semiconductor integrated circuit will be explained with reference to FIG. 2.

The testing method shown herein is to check the variation of the output voltages among voltage output terminals 2 (2a to 2c). In practice, the first reference voltage which corresponds to the range of the permissible variation of the output voltages from voltage output terminals 2 (2a to 2c) is applied to the reference voltage input terminal, designated at 41 and the result of judgement output from judgment output port 52 is displayed on judgment display portion 80.

According to this method, it is possible to precisely, rapidly and economically check the voltages output from voltage output terminals 2 (2a to 2c) and their variation with respect to the mean value of these using a general-purpose semiconductor tester, without the necessity of an extra voltage source for providing ideal voltages to be output from the voltage output terminals 2 (2a to 2c) for comparison to the actual voltages therefrom.

For example, in the case of a LCD driver IC for a LCD having 480 outputs with 256 tones, the variation of the output voltages can be checked rapidly without performing direct measurement of the voltages using potentiometric devices but can be done all at once by connecting each of the 480 outputs to a resistor and potentiometric device. In this case a detection accuracy as down to as low as about 5 mV can be readily attained.

Next, the examination of the errors of the output voltages from voltage output terminals 2 (2a to 2c) will be described using the same figure.

In practice, the mean voltage of the output voltages from voltage output terminals 2 (2a to 2c), output from mean voltage output terminal 54 is measured by comparing circuit 81 of the semiconductor tester. In this measurement, the permissible error of the mean voltage value from the ideal voltage value is output as the second reference value from second reference voltage setting circuit 82 to comparing circuit 81. In this embodiment, this second reference voltage is set at 10 mV. This second reference voltage may also be set at a value different from that of the embodiment depending on the semiconductor integrated circuit to be tested.

According to this method, it is possible to estimate the rough error of the output voltages from voltage output terminals 2 with respect to the ideal voltage without performing direct measurement of the output voltages from all the output voltage terminals 2. Further, implementation of this method in combination with the aforementioned detecting method of the variation of the output voltages from voltage output terminals 2 (2a to 2c) enables a more reliable check of the output voltages from voltage output terminals 2.

For example, for a case of a LCD driver IC for a LCD having 480 outputs with 256 tones, the measurement as to its output voltage error can be carried out by only 512 voltmetric measurements (256 tones×2) because of positive and negative voltages for each tone, so the measurement can be finished in about 50 milliseconds if 0.1 millisecond is needed for each measurement.

In the above testing method, both the error and variation of output voltages from the voltage output terminals are checked, but either one of them may be chosen and checked depending on the specifications demanded for the semiconductor integrated circuit to be tested.

Figure 4:
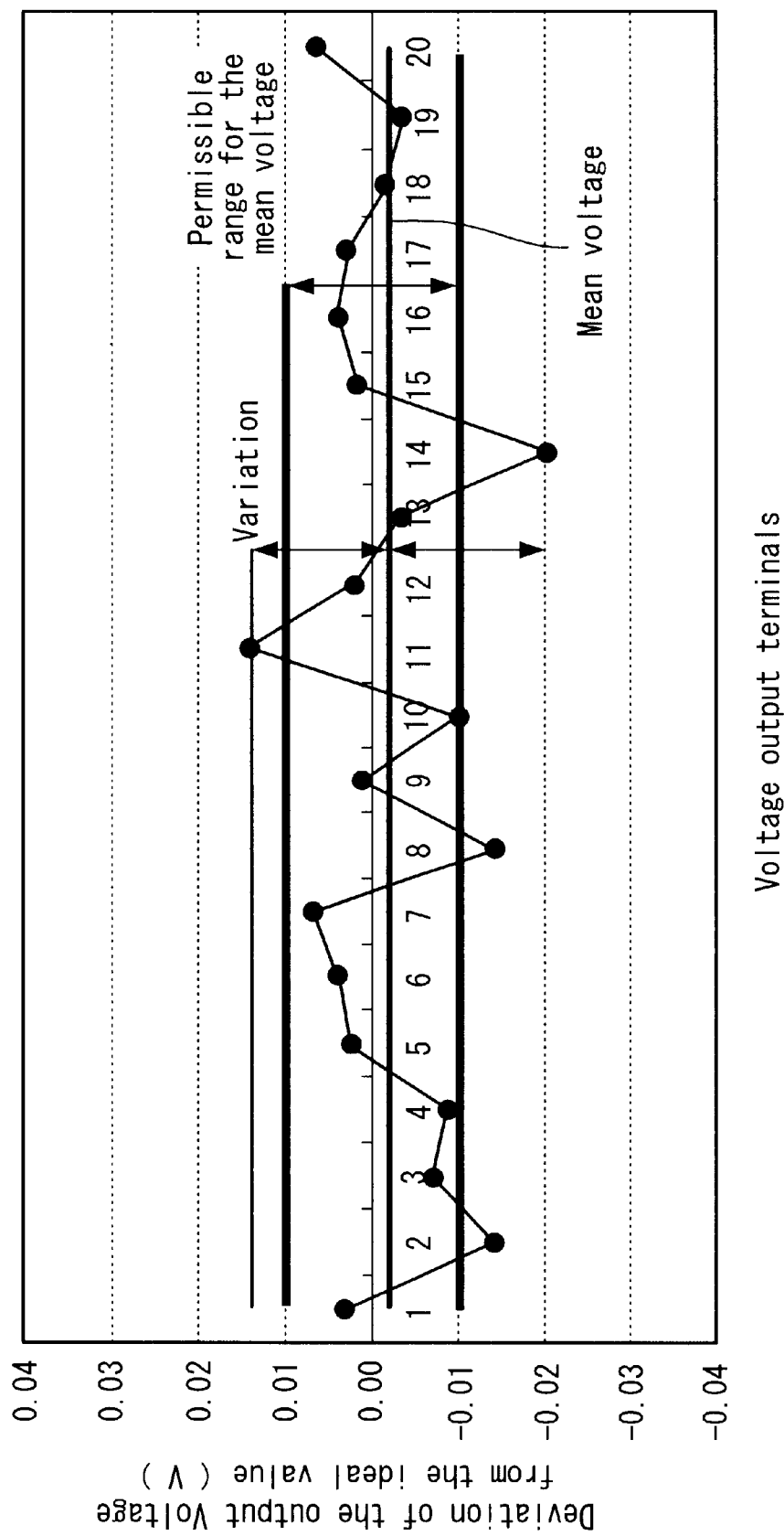
FIG. 4 is a chart showing one example of the measurement result in the present invention.

FIG. 4 is a chart showing one example of suitable judgement of the output voltages at voltage output terminals 2 in the present invention. In this example, a semiconductor integrated circuit is tested by measuring the output voltages from voltage output terminals 2 and determining their mean voltage, checking whether the mean voltage falls within the range of the ideal value ±10 mV and checking whether the variation of the output voltages from output voltage terminals 2 falls within the range of the mean value ±17.5 mV.

Figure 5:
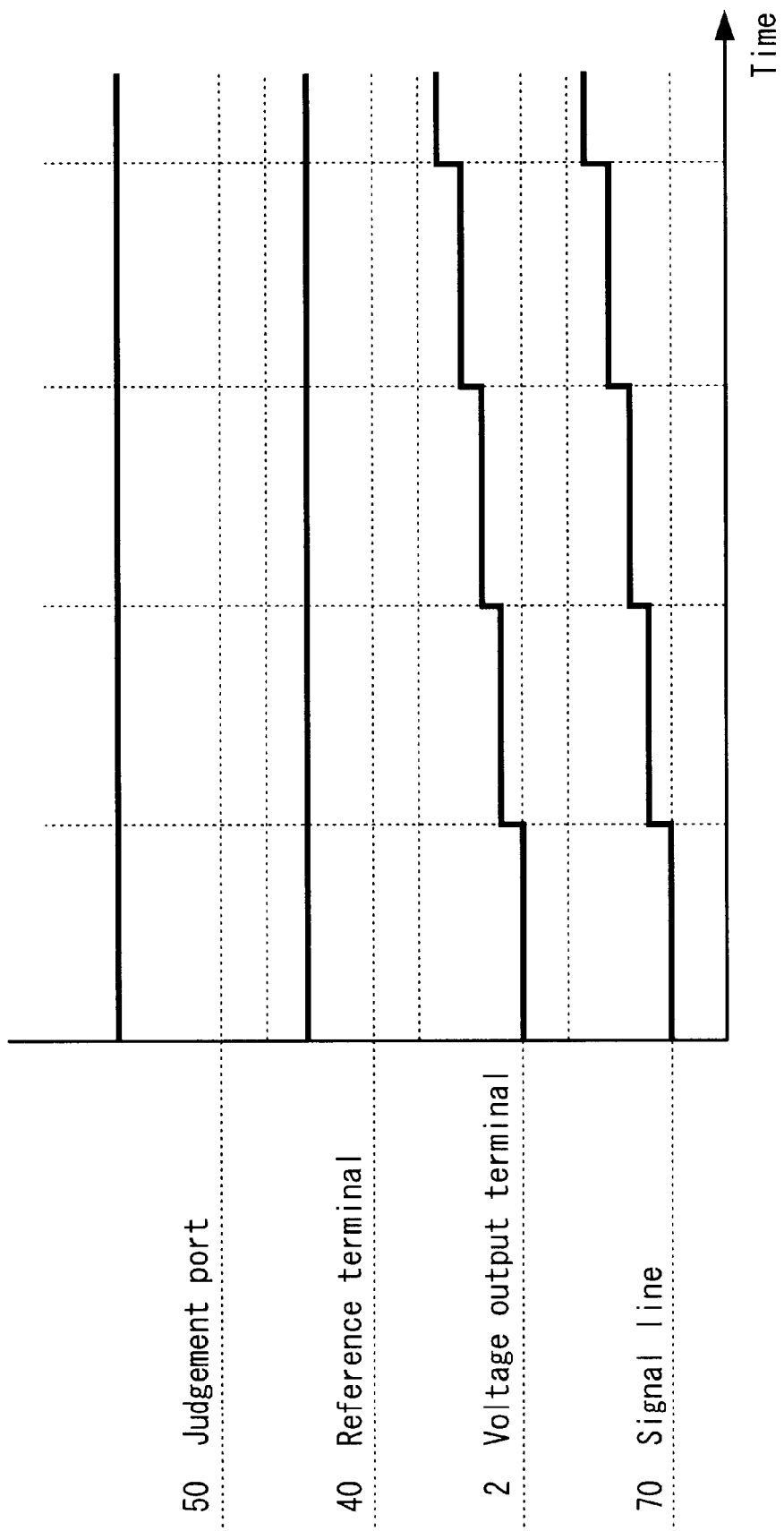
FIG. 5 is a chart showing the relationship between time and potentials in the present embodiment.

FIG. 5 is a chart showing the potentials of the different terminals and signal line 70 when a tonal voltage test of multi-tonal output terminals 2 was carried out by the configuration shown in FIG. 2. In this example, the permissible voltage width is constant for all the tones. As understood from this chart, when the permissible voltage width is constant for all the tones, the first reference voltage to be input to reference terminal 40 may and should be constant for all tonal voltage tests. Therefore, it is no longer necessary to switch the voltage for comparison testing every tonal level change, which was needed in the conventional configuration.

Signal line 70 presents the mean potential of the voltages output from all the connected voltage output terminals 2. Therefore, there is no need of providing a separate voltage source for the ideal voltages to be output from voltage output terminals 2.

Figure 6:
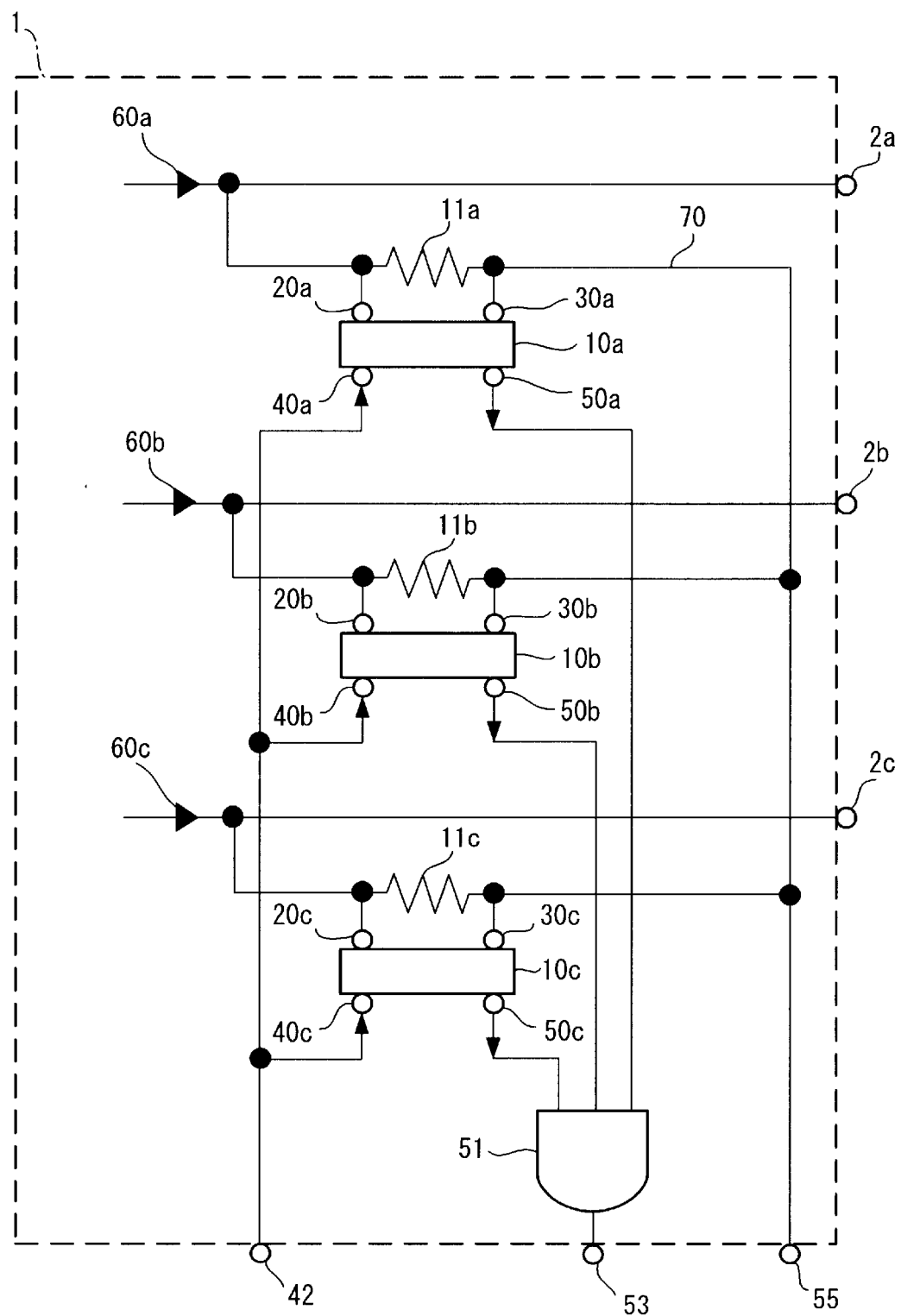
FIG. 6 is a diagram showing one example of a semiconductor integrated circuit configuration according to the present invention.

FIG. 6 is a diagram showing a configuration of a semiconductor integrated circuit 1 having resistors 11 (11a to 11c) and potentiometric devices 10 (10a to 10c) built therein.

For this integrated circuit, the application of only the first reference voltage to a reference voltage input pin 42 from the semiconductor tester side without the necessity of performing direct voltage measurement makes it possible to check the variation of the output voltages from voltage output terminals 2 (2a to 2c) in a similar manner to the way the usual functional test is carried out.

In addition, since this configuration has a mean voltage output pin 55 for measuring the potential of signal line 70, measurement of the voltage at mean voltage output pin 55 makes it possible to check whether the deviation of the mean voltage of voltage output terminals 2 (2a to 2c) from the ideal voltage falls within the permissible range.

In practical use of semiconductor integrated circuit 1, if connection of resistors 11 (11a to 11c) to potentiometric devices 10 (10a to 10c) causes any adverse effect, this can be dealt with by enlargement of the resistance of resistors 11 (11a to 11c), inter position of a buffer 60 or a switch between voltage output terminal 2 (2a to 2c) and resistor 11 (11a to 11c), or other methods.

Further, since the voltage applying means usually provided for a normal semiconductor tester can be used for the above method, it is possible to implement the test rapidly, accurately and nevertheless economically, using a low-cost semiconductor tester. Here, since the integration of these resistors, potentiometric devices and logical product operating means can be implemented by a usual semiconductor IC fabrication process, the description of the process is omitted.

As described heretofore, according to the present invention, the output voltages of a semiconductor integrated circuit having a multiple number of output terminals which output predetermined voltages are checked with reference to the mean voltage value of the voltages output from all the output terminals. That is, this mean voltage value is used as the reference voltage value, based on which the suitability of the output voltage from each of the output terminals is judged. Thus, this configuration makes it possible to simplify the setting of the reference voltage value, which should be changed every time the voltage to be tested is changed for a different level of tone It is also possible to reduce the number of voltage sources needed when comparison with the reference voltage values is to be made.

Since the judgement means or judgement signal output means includes a multiple number of resistors connected at their first ends to the respective output terminals and at their second ends to a common signal line, the common line connected to the second ends of the resistors presents the mean value of all the output voltages, conforming to the Kirchhoff's law. Therefore, the potential difference between both ends of each resistor can be detected easily as the deviation of the potential at the output terminal to which the first end of the resistor is connected, from the mean output voltage value.

Further, since a first comparing means which compares this deviation with the first reference voltage value as the permissible value of variation and determines if each deviation falls within the permissible range is provided, it is possible to detect any anomaly instantly if any of the output terminals has a defect.

Moreover, this first reference voltage can and should be constant throughout the voltage test when the permissible voltage width is constant for all the tones. Therefore, it is no longer necessary to switch the reference voltage, which would have had to be changed every time the voltage to be tested should have been changed depending on the level of tone.

Since the judgement means or judgement signal output means includes a second comparing means for comparing the mean voltage value with a predetermined second reference voltage value, it is possible to smoothly perform rough detection of the error or deviation from the voltage to be output from each output terminal without performing direct measurement of the output voltages from all the terminals.

Thus, it is possible to provide a simple and low-cost semiconductor tester, semiconductor integrated circuit and semiconductor testing method, which make it possible to perform rapid check of output voltages from a multiple number of output terminals of a semiconductor integrated circuit.

What is claimed is:

1. A semiconductor tester for checking the output voltages of a semiconductor integrated circuit having a multiple number of output terminals which output predetermined voltages, comprising:

a judgement means which, with reference to the mean voltage value of the voltages output from all the output terminals of the semiconductor integrated circuit, judges the suitability of the output voltage from each of the output terminals.

2. The semiconductor tester according to claim 1, wherein the judgment means comprises a second comparing means for comparing the mean voltage value with a predetermined second reference voltage value.

3. A semiconductor integrated circuit having a multiple number of output terminals which output predetermined voltages, comprising: a judgement signal output means which, with reference to the mean voltage value of the voltages output from all the output terminals, outputs signals representing the suitability of the output voltages from the output terminals.

4. The semiconductor integrated circuit according to claim 3, wherein the judgment signal output means comprises a second comparing means for comparing the mean voltage value with a predetermined second reference voltage value.

5. A semiconductor testing method of checking the output voltages of a semiconductor integrated circuit having a multiple number of output terminals which output predetermined voltages, comprising the step of judging the suitability of the output voltage from each of the output terminals, with reference to the mean voltage value of the voltages output from all the output terminals of the semiconductor integrated circuit.

6. The semiconductor testing method according to claim 5, wherein the step of judgement includes a second comparing step for comparing the mean voltage value with a predetermined second reference voltage value.

* * * * *